(12) United States Patent
Park (10) Patent No.: US 11,089,695 B2
(45) Date of Patent: *Aug. 10, 2021

(54) FOLDABLE DISPLAY APPARATUS

(71) Applicant: SAMSUNG DISPLAY CO., LTD., Yongin-si (KR)

(72) Inventor: Changmin Park, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/190,060

(22) Filed: Nov. 13, 2018

(65) Prior Publication Data
US 2019/0082544 A1    Mar. 14, 2019

Related U.S. Application Data

(63) Continuation of application No. 15/286,363, filed on Oct. 5, 2016, now Pat. No. 10,694,623.

(30) Foreign Application Priority Data

Nov. 16, 2015 (KR) .......................... 10-2015-0160452

(51) Int. Cl.
*H05K 5/00* (2006.01)
*G06F 1/16* (2006.01)
(Continued)

(52) U.S. Cl.
CPC ......... *H05K 5/0017* (2013.01); *G06F 1/1616* (2013.01); *G06F 1/1652* (2013.01);
(Continued)

(58) Field of Classification Search
CPC ...... H05K 5/0017; H05K 5/0226; H05K 5/03; G09F 9/301; G06F 1/1616; G06F 1/1681; G06F 1/1652
See application file for complete search history.

(56) References Cited

U.S. PATENT DOCUMENTS 9,086,850 B2    7/2015  Verschoor et al.
9,164,547 B1 *  10/2015 Kwon ................... G06F 1/1656
(Continued)

FOREIGN PATENT DOCUMENTS

CN         102640074 A    8/2012
CN         103106845 A    5/2013
(Continued)

OTHER PUBLICATIONS

U.S. Office Action dated Apr. 1, 2019, issued in U.S. Appl. No. 15/286,363, 16 pages.
(Continued)

*Primary Examiner* — Abhishek M Rathod
(74) *Attorney, Agent, or Firm* — Lewis Roca Rothgerber Christie LLP (57) ABSTRACT

A foldable display apparatus includes a first housing, a second housing, a folding portion at a space between the first housing and the second housing to connect the first housing to the second housing so that the first and second housings are configured to be folded with respect to each other, a flexible display including a contraction surface supported by the first housing, the second housing, and the folding portion, and a tensile surface configured to display images, and a hinge holder configured to move between a first location for inhibiting folding of the folding portion, and a second location for enabling folding of the folding portion.

31 Claims, 9 Drawing Sheets

(51) Int. Cl.
*H05K 5/02* (2006.01)
*H05K 5/03* (2006.01)
*G09F 9/30* (2006.01)

(52) U.S. Cl.
CPC ............ *G06F 1/1681* (2013.01); *G09F 9/301* (2013.01); *H05K 5/0226* (2013.01); *H05K 5/03* (2013.01)

(56) References Cited

U.S. PATENT DOCUMENTS

| | | | |
|---|---|---|---|
| 9,176,535 B2 | 11/2015 | Bohn et al. | |
| 9,204,565 B1 | 12/2015 | Lee et al. | |
| 9,395,070 B2 | 7/2016 | Endo | |
| 9,603,271 B2 | 3/2017 | Lee et al. | |
| 9,606,583 B2 | 3/2017 | Ahn et al. | |
| 9,729,688 B2 | 8/2017 | Lee et al. | |
| 10,091,896 B2 | 10/2018 | Chu | |
| 10,141,527 B2 | 11/2018 | Hsieh et al. | |
| 2003/0026068 A1 | 2/2003 | Tsai et al. | |
| 2012/0236484 A1 | 9/2012 | Miyake | |
| 2012/0307423 A1* | 12/2012 | Bohn | G06F 1/1641 361/679.01 |
| 2012/0307472 A1* | 12/2012 | Bohn | G06F 1/1616 361/807 |
| 2013/0010405 A1 | 1/2013 | Rothkopf et al. | |
| 2013/0342090 A1 | 12/2013 | Ahn et al. | |
| 2014/0196254 A1 | 7/2014 | Song | |
| 2014/0226275 A1 | 8/2014 | Ko et al. | |
| 2015/0043174 A1 | 2/2015 | Han et al. | |
| 2015/0055287 A1 | 2/2015 | Seo | |
| 2015/0077917 A1 | 3/2015 | Song | |
| 2015/0089974 A1* | 4/2015 | Seo | A44C 5/0076 63/1.13 |
| 2015/0233162 A1 | 8/2015 | Lee et al. | |
| 2015/0277496 A1 | 10/2015 | Reeves et al. | |
| 2015/0296946 A1 | 10/2015 | Buechin | |
| 2015/0325804 A1* | 11/2015 | Lindblad | H01L 51/52 313/511 |
| 2015/0330614 A1 | 11/2015 | Lee et al. | |
| 2016/0007441 A1 | 1/2016 | Matsueda | |
| 2016/0018855 A1 | 1/2016 | Liao et al. | |
| 2016/0070303 A1 | 3/2016 | Lee et al. | |
| 2016/0091923 A1 | 3/2016 | Morrison et al. | |
| 2016/0139634 A1* | 5/2016 | Cho | G06F 1/1652 361/679.27 |
| 2016/0187935 A1 | 6/2016 | Tazbaz et al. | |
| 2016/0299539 A1 | 10/2016 | Jang | |
| 2017/0006725 A1 | 1/2017 | Ahn et al. | |
| 2017/0131118 A1 | 5/2017 | Kauhaniemi et al. | |
| 2017/0192460 A1 | 7/2017 | Watanabe et al. | |

FOREIGN PATENT DOCUMENTS

| | | |
|---|---|---|
| CN | 203658927 U | 6/2014 |
| CN | 103927940 A | 7/2014 |
| CN | 104838328 A | 8/2015 |
| CN | 104851365 A | 8/2015 |
| CN | 104851889 A | 8/2015 |
| CN | 204576991 U | 8/2015 |
| CN | 104900153 A | 9/2015 |
| KR | 10-2014-0026547 A | 3/2014 |
| KR | 10-1386220 B1 | 4/2014 |
| KR | 10-2014-0101295 A | 8/2014 |
| KR | 10-2015-0001142 A | 1/2015 |
| KR | 10-2015-0017819 A | 2/2015 |
| KR | 10-2015-0024172 A | 3/2015 |
| KR | 10-2015-0031602 A | 3/2015 |
| KR | 10-2016-0083318 | 7/2016 |

OTHER PUBLICATIONS

U.S. Final Office Action dated Dec. 4, 2018, issued in U.S. Appl. No. 15/286,363 (9 pages).
Chinese Office Action dated May 25, 2021, Application No. 201811357956.1, 5 pages.

* cited by examiner

FOLDABLE DISPLAY APPARATUS

CROSS-REFERENCE TO RELATED APPLICATION

This application is a continuation of U.S. patent application Ser. No. 15/286,363, filed Oct. 5, 2016, which claims priority to and the benefit of Korean Patent Application No. 10-2015-0160452, filed Nov. 16, 2015, the entire content of both of which is incorporated herein by reference.

BACKGROUND

1. Field

One or more embodiments relate to a foldable display apparatus capable of preventing deformation at a bending region.

2. Description of the Related Art

As technologies regarding display devices have evolved, flexible display apparatuses, rollable display apparatuses, and foldable display apparatuses have been researched and developed.

Display panels in such above display devices may be implemented to be flexible, rollable, or foldable by using a plastic substrate, and flexibility may be further improved by reducing a thickness of a display panel. In addition to being used in flat panel displays, flexible displays may also be used in a transformed three-dimensional (3D) way due to their flexibility.

However, in conventional foldable display apparatuses, buckling may occur at a folding region of a flexible display when folding, or due to repeated folding of, the foldable display apparatuses.

It should be noted that information disclosed in this Background section may contain information that does not form the prior art.

SUMMARY

One or more embodiments include a foldable display apparatus.

Additional aspects will be set forth in part in the description that follows and, in part, will be apparent from the description, or may be learned by practice of the presented embodiments.

According to one or more embodiments, a foldable display apparatus includes a first housing, a second housing, a folding portion at a space between the first housing and the second housing to connect the first housing to the second housing so that the first and second housings are configured to be folded with respect to each other, a flexible display including a contraction surface supported by the first housing, the second housing, and the folding portion, and a tensile surface configured to display images, and a hinge holder configured to move between a first location for inhibiting folding of the folding portion, and a second location for enabling folding of the folding portion.

The first housing may include a first hinge cover that is pivotally connected to a first hinge shaft adjacent the second housing, the second housing may include a second hinge cover that is pivotally connected to a second hinge shaft adjacent the first housing, and the first hinge cover and the second hinge cover may overlap each other, and may be configured to be rotated with respect to each other.

The folding portion may be configured to be covered by the first hinge cover and the second hinge cover.

The first housing may further include a third hinge shaft away from the second housing, and a first housing cover that is pivotally connected to the third hinge shaft, and that is configured to move according to rotation of the first hinge cover.

The second housing may further include a fourth hinge shaft away from the first housing, and a second housing cover that is pivotally connected to the fourth hinge shaft, and that is configured to pivot according to rotation of the second hinge cover.

The first housing may include a hinge cover having a first end that is pivotally connected to a first hinge shaft that is provided adjacent to the second housing, and the second housing may define a guide groove for guiding the hinge cover so that a second end of the hinge cover is configured to slide along a lengthwise direction of the second housing.

The first housing may further include a second hinge shaft away from the second housing, and a housing cover that is pivotally connected to the second hinge shaft, and that is configured to pivot according to rotation of the hinge cover.

The folding portion may include a plurality of multi-joint members that are successively arranged in a lengthwise direction of the flexible display, a support plate configured to support the flexible display, and an attaching layer connecting the plurality of multi-joint members to the support plate.

The plurality of multi-joint members may have elasticity.

The plurality of multi-joint members may include plastic or metal.

The support plate may include an Invar alloy.

A first surface of the support plate may contact the first housing, the second housing, and the plurality of multi-joint members, and a second surface of the support plate may contact the contraction surface of the flexible display.

The contraction surface of the flexible display may be configured to contract and fold, the tensile surface of the flexible display may be configured to stretch and fold, and the contraction surface of the flexible display may be configured to be located inside the tensile surface, when the folding portion is folded.

The hinge holder may be on the first housing or the second housing, and may be configured to linearly move toward the folding portion.

The folding portion may include a plurality of multi-joint members successively arranged in a lengthwise direction of the flexible display, a support plate configured to support the flexible display, and an attaching layer connecting the plurality of multi-joint members to the support plate, and the plurality of multi-joint members may collectively define a holding hole for accommodating the hinge holder.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1:
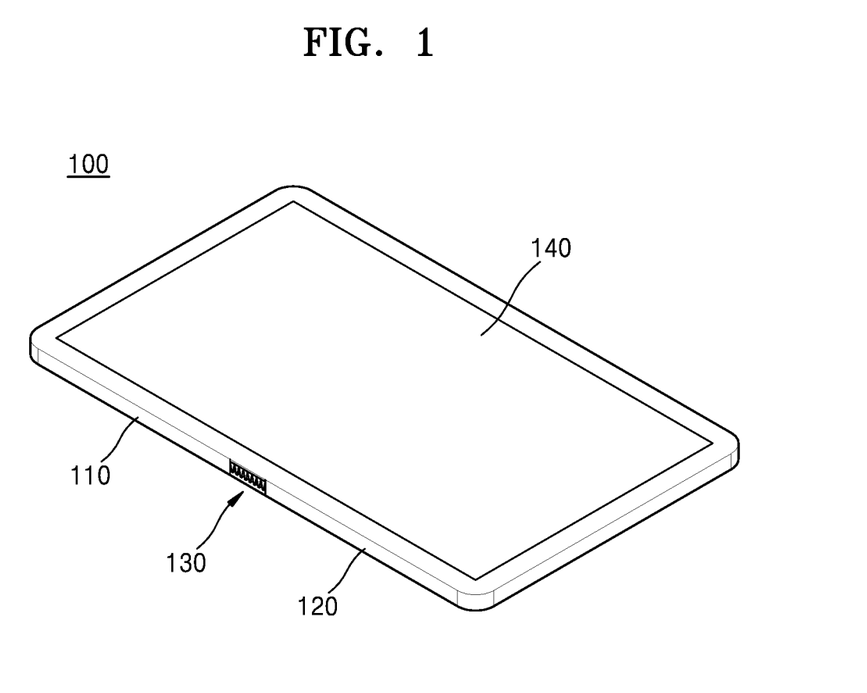
FIG. 1 is a perspective view of a foldable display apparatus according to an embodiment.
Figure 2A:
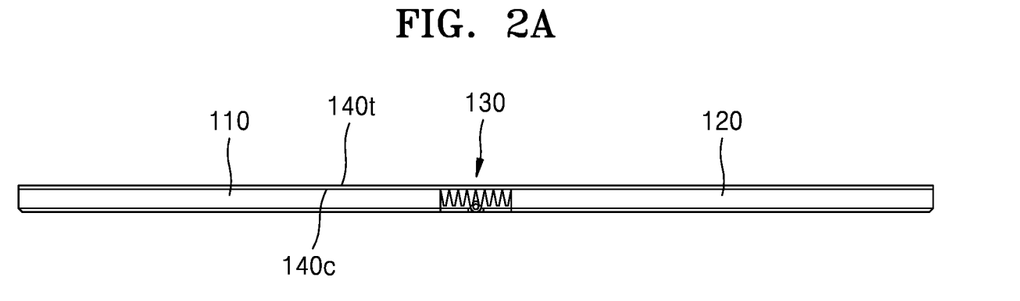
FIGS. 2A, 2B, and 2C are side views showing operating examples of the foldable display apparatus of FIG. 1.
Figure 2B:
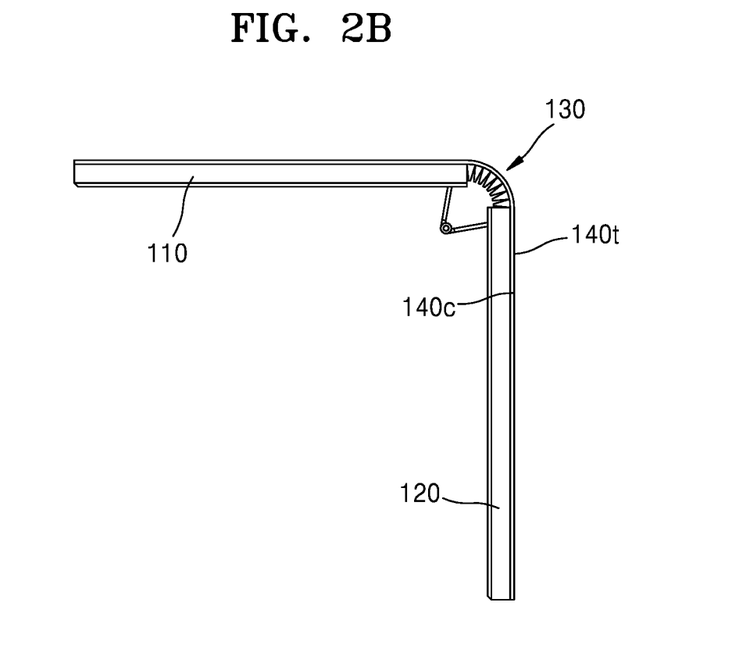
Figure 2C:
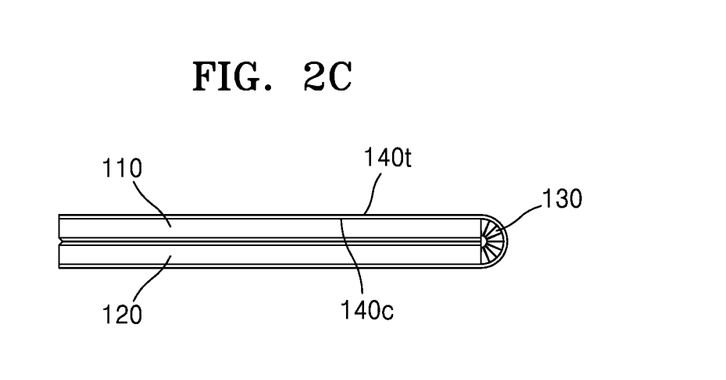

FIG. 1 is a perspective view of a foldable display apparatus 100 according to an embodiment, and FIG. 2A to 2C are side view showing operating examples of the foldable display apparatus 100 of FIG. 1.

Referring to FIGS. 1 and 2, the foldable display apparatus 100 includes a first housing 110, a second housing 120, a folding portion 130, and a flexible display 140.

The first housing 110 and the second housing 120 are spaced from each other. The folding portion 130 may be provided at a space between the first housing 110 and the second housing 120, and may connect the first housing 110 and the second housing 120 to each other so that the first housing 110 and the second housing 120 may be foldable toward each other.

The flexible display 140 may include a foldable display panel and a device. A contraction surface 140c of the flexible display 140 may be supported by the first housing 110, the second housing 120, and the folding portion 130, and a tensile surface 140t of the flexible display 140 may produce visible images.

In particular, the flexible display 140 may display images that are generally produced by a display device (e.g., text, videos, pictures, two-dimensional (2D) or three-dimensional (3D) images, icons, and cursors). For example, if the display device is a portable computer, images, such as a user interface (UI) or a graphical user interface (GUI) regarding the portable computer, may be displayed.

In addition, the flexible display 140 may include a flexible substrate including a foldable plastic material or a metal foil, and may also include a pixel unit and a passivation layer on the flexible substrate. The flexible display 140 may be an organic light-emitting display device, a liquid crystal display (LCD) device, or an electrophoretic display device, although the flexible display 140 is not limited thereto.

The foldable display apparatus 100 according to the present embodiment may be in an unfolded state, as shown in FIG. 2A, may be partially folded at an angle, as shown in FIG. 2B, or may be in a completely folded state by folding the first housing 110 with respect to the second housing 120, as shown in FIG. 2C.

Detailed configurations and structures of the foldable display apparatus 100 according to the embodiment will be described in more detail below with reference to FIGS. 3, 4, 5, 6A, 6B, 7A, and 7B.

Figure 3:
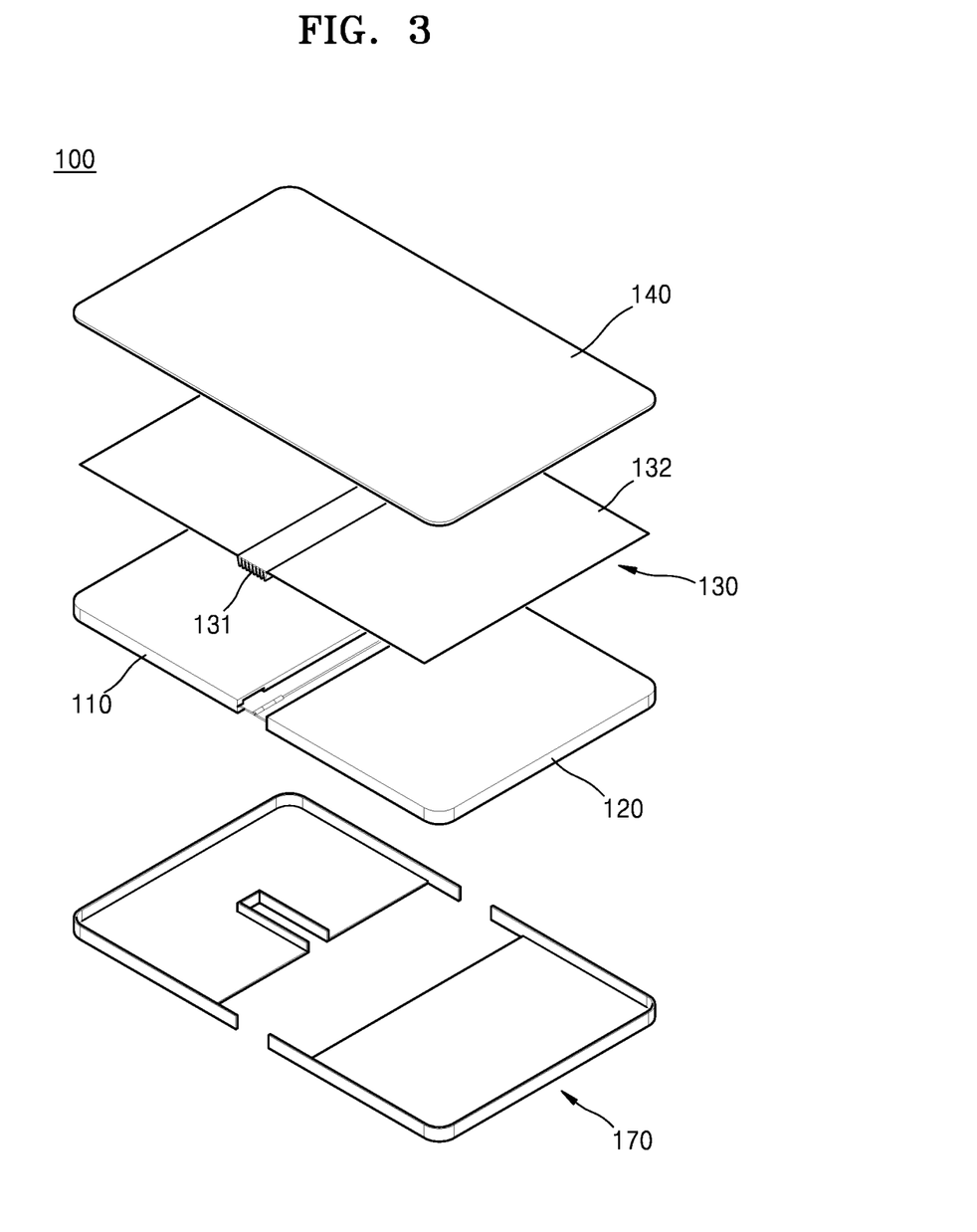
FIG. 3 is a schematically exploded perspective view of the foldable display apparatus of FIG. 1.
Figure 4:
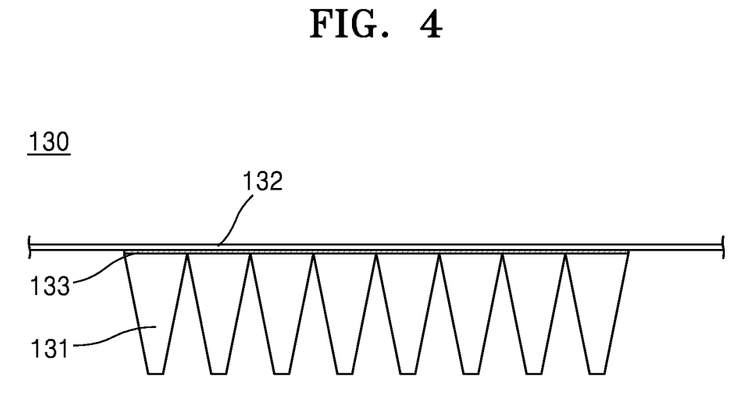
FIG. 4 is an enlarged side view showing a part of a folding portion of FIG. 3.
Figure 5:
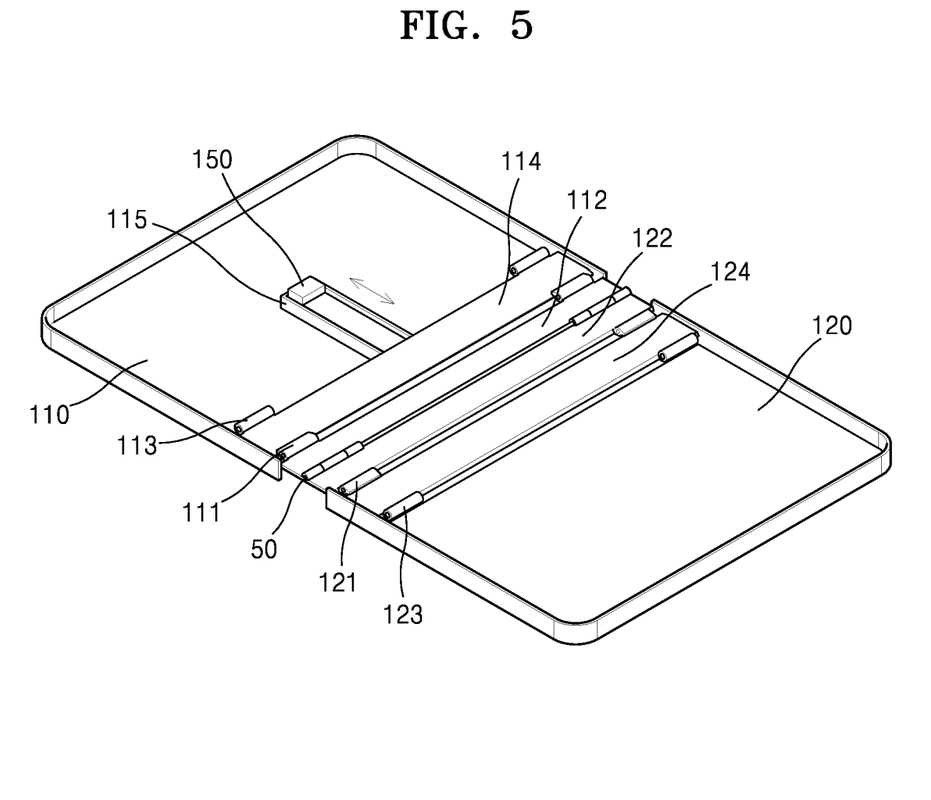
FIG. 5 is a perspective view showing rear surfaces of a first housing and a second housing of FIG. 3.
Figure 6A:
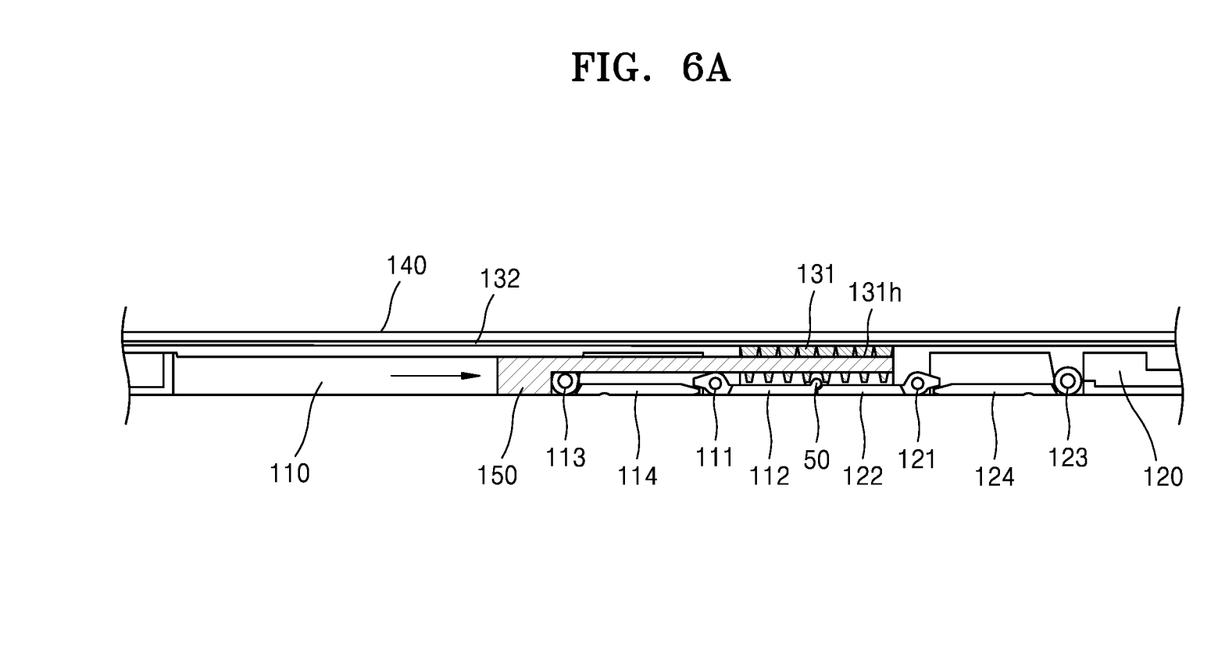
FIGS. 6A and 6B are side sectional views showing operating examples of a hinge holder of FIG. 5.
Figure 6B:
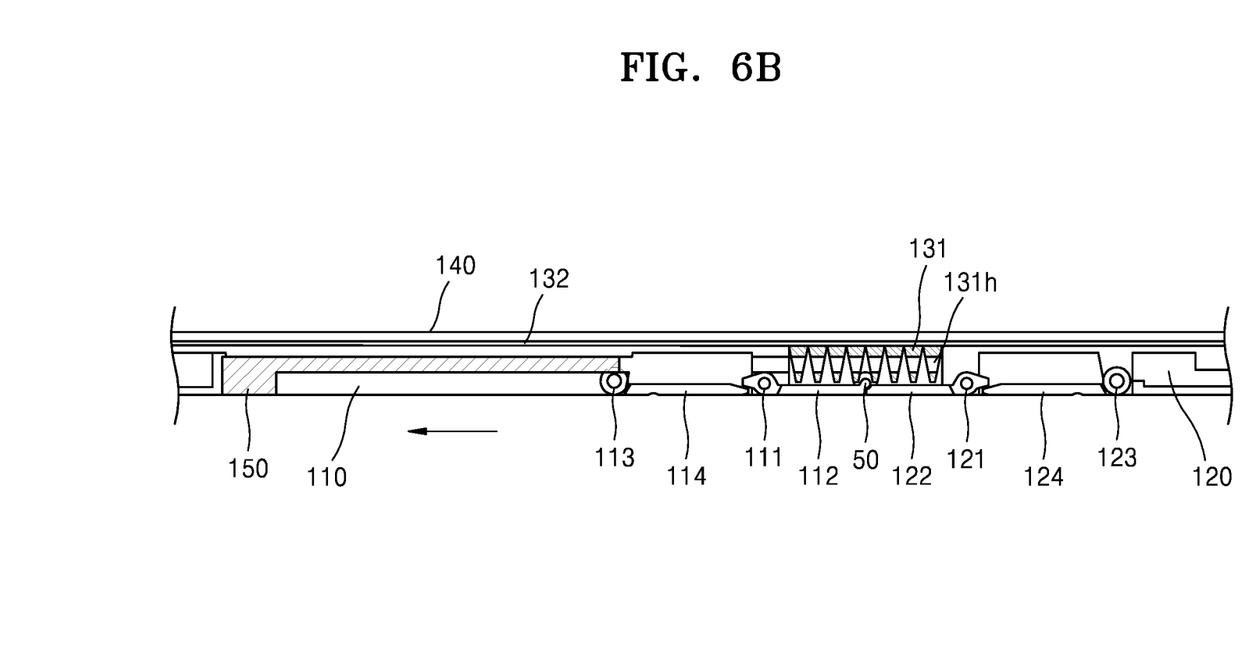

FIG. 3 is a schematically exploded perspective view of the foldable display apparatus 100 of FIG. 1, FIG. 4 is an enlarged side view showing a part of the folding portion 130 of FIG. 3, FIG. 5 is a perspective view showing rear surfaces of the first housing 110 and the second housing 120 of FIG. 3, and FIGS. 6A and 6B are side sectional views showing operating examples of a hinge holder of FIG. 5.

Referring to FIGS. 3 and 4, the folding portion 130 includes a plurality of multi-joint members 131 that are successively arranged in a lengthwise direction of the flexible display 140, a support plate 132 supporting the flexible display 140, and an attaching layer 133 connecting the plurality of multi-joint members 131 to the support plate 132.

Each of the multi-joint members 131 may include plastic or metal so as to have an elastic force. However, the multi-joint members 131 may include a material having sufficient rigidity to have durability in view of repeated folding and unfolding operations of the foldable display apparatus 100.

The support plate 132 may include an INVAR® alloy (INVAR is a registered trademark of Aperam Alloys IMPHY Joint Stock Company), although the support plate 132 is not limited thereto. For example, the support plate 132 may include a metal sheet having a rigidity that is sufficient to endure repeated folding and unfolding operations of the flexible display 140.

In particular, the support plate 132 may support the contraction surface 140c of the flexible display 140, and may cover all of the first housing 110, the second housing 120, and the folding portion 130. That is, the support plate 132 has an area corresponding to a size of the flexible display 140, and may have a size corresponding to the area occupied by the flexible display 140 on the first housing 110, on the second housing 120, and on the folding portion 130.

The attaching layer 133 is between the multi-joint members 131 and the support plate 132, and may include a material having an adhesive force for attaching the multi-joint members 131 to the support plate 132.

Referring to FIGS. 5, 6A, and 6B, the foldable display apparatus 100 may include a hinge holder 150 that is moveable between a first location (see FIG. 6A), where the folding operation of the folding portion 130 is restricted/inhibited, and a second location (see FIG. 6B), where the folding operation of the folding portion 130 is allowed/enabled.

The hinge holder 150 may be provided on the first housing 110 or the second housing 120, and may be configured to linearly move toward the folding portion 130. In FIGS. 5, 6A, and 6B, the hinge holder 150 is described as being provided on the first housing 110, although the hinge holder 150 may be provided on the second housing 120 in other embodiments.

In addition, the multi-joint member 131 of the folding portion 130 may include a holding hole (e.g., may collectively define a holding hole, or holding groove) 131h for accommodating the hinge holder 150.

That is, as shown in FIG. 6A, when the hinge holder 150 is accommodated in the holding hole 131h of the multi-joint member 131, the folding operation of the folding portion 130 is restricted, and accordingly, the folding of the foldable display apparatus 100 may be restricted.

On the other hand, as shown in FIG. 6B, when the hinge holder 150 is drawn out from the holding hole 131h of the multi-joint member 131, the folding operation of the folding portion 130 is allowed such that the foldable display apparatus 100 is able to be folded.

When the foldable display apparatus 100 includes the above described structure, such as the hinge holder 150, the unfolding/unfolded state of the flexible display 140 may be easily maintained. In addition, because the folding portion 130 is restricted so that the flexible display 140 may fold only in one direction, the occurrence of a buckling phenomenon due to a contraction of the tensile surface 140t of the flexible display, or due to tension of the contraction surface 140c, may be prevented.

In addition, the first housing 110 may include a first hinge cover 112, which is pivotally connected to a first hinge shaft 111, adjacent the second housing 120, and the second housing 120 may include a second hinge cover 122, which is pivotally connected to a second hinge shaft 121, adjacent the first housing 110.

Figure 7A:
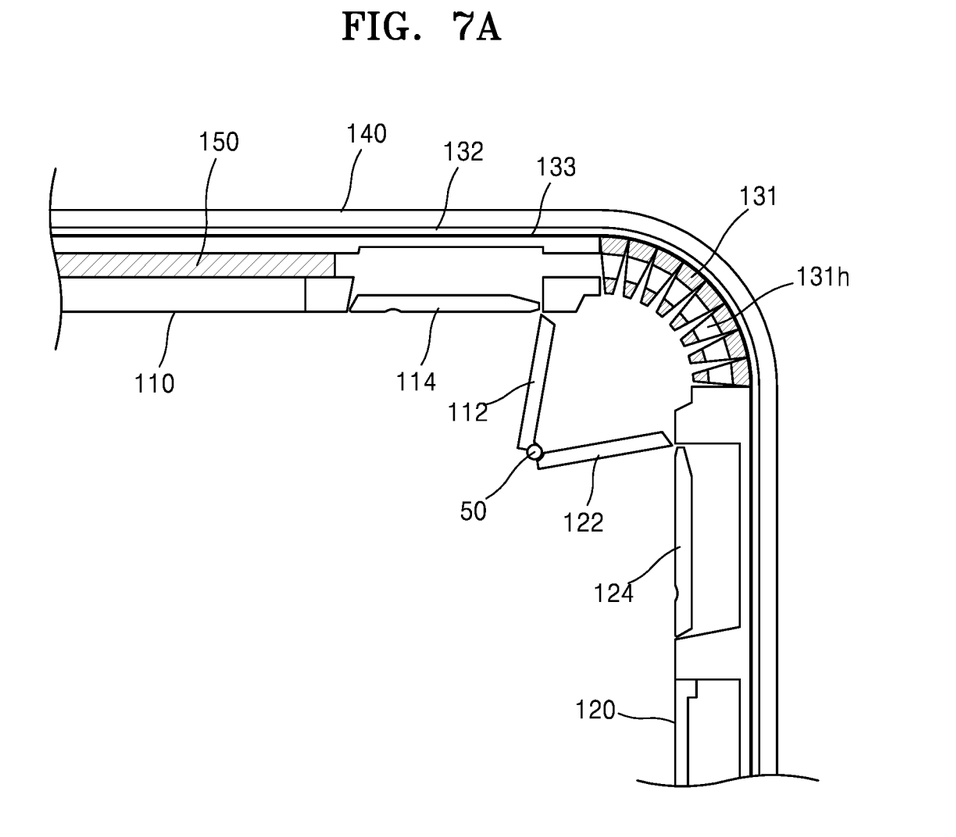
FIGS. 7A and 7B are side sectional views showing operating examples of the folding portion.

Here, the first hinge cover 112 and the second hinge cover 122 may be connected to each other while overlapping each other at an overlapping axis 50 so as to pivot with each other (e.g., see FIG. 7A). The overlapping axis 50 may be provided as a separate member, but may be a virtual axis where the first hinge cover 112 and the second hinge cover 122 are pivotally connected to each other. The folding portion 130 is covered by the first hinge cover 112 and the second hinge cover 122, and then, may be provided at the inside of the first and second housings 110 and 120.

Figure 7B:
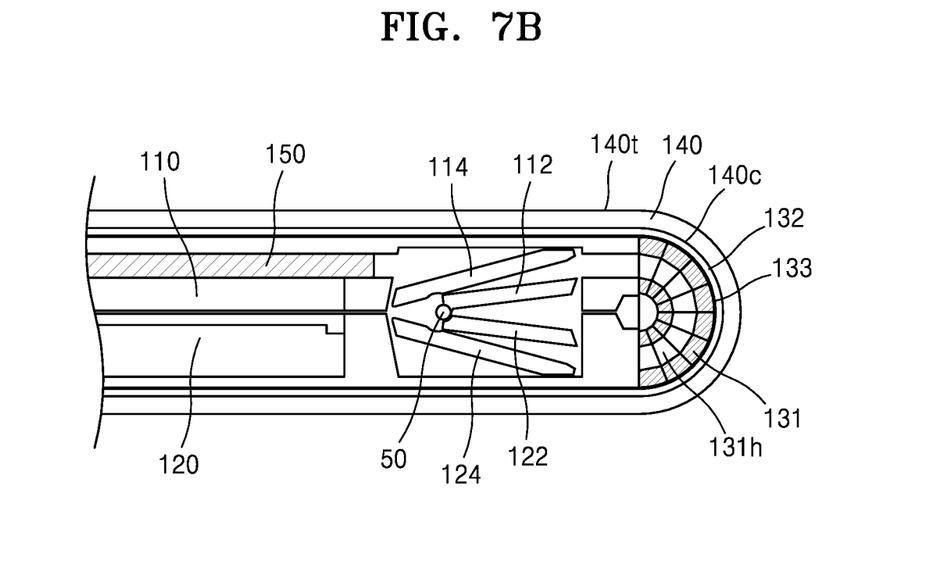

In addition, the first housing 110 may further include a third hinge shaft 113 that is provided away from the second housing 120, and a first housing cover 114 that is pivotally connected to the third hinge shaft 113, and may be rotated according to the rotation of the first hinge cover 112 (e.g., see FIGS. 7A and 7B).

The second housing 120 may further include a fourth hinge shaft 123 that is provided away from the first housing 110, and a second housing cover 124 that is pivotally connected to the fourth hinge shaft 123, and may be rotated according to the rotation of the second hinge cover 122 (e.g., see FIGS. 7A and 7B).

Referring back to FIG. 3, the above described elements provided on lower surfaces of the first housing 110 and the second housing 120 shown in FIGS. 5, 6A, and 6B may be covered by a case 170.

FIGS. 7A and 7B are side sectional views showing operating examples of the folding portion 130.

FIG. 7A shows a case in which the hinge holder 150 is withdrawn from the holding hole 131h to allow folding of the folding portion 130. As described above, when the folding portion 130 is folded, the first hinge cover 112 and the second hinge cover 122 are rotated together about the overlapping axis 50 according to the folding operation of the folding portion 130.

FIG. 7B shows a case in which the folding portion 130 is completely folded so that the plurality of multi-joint members 131 are adjacent one another. That is, when the folding portion 130 is completely folded, the first housing 110 and the second housing 120 are folded with respect to each other, and accordingly, the contraction surface 140c of the flexible display 140 is contracted, and the tensile surface 140t of the flexible display 140 is stretched so that the foldable display apparatus 140 is folded (e.g., folded in half).

Figure 8:
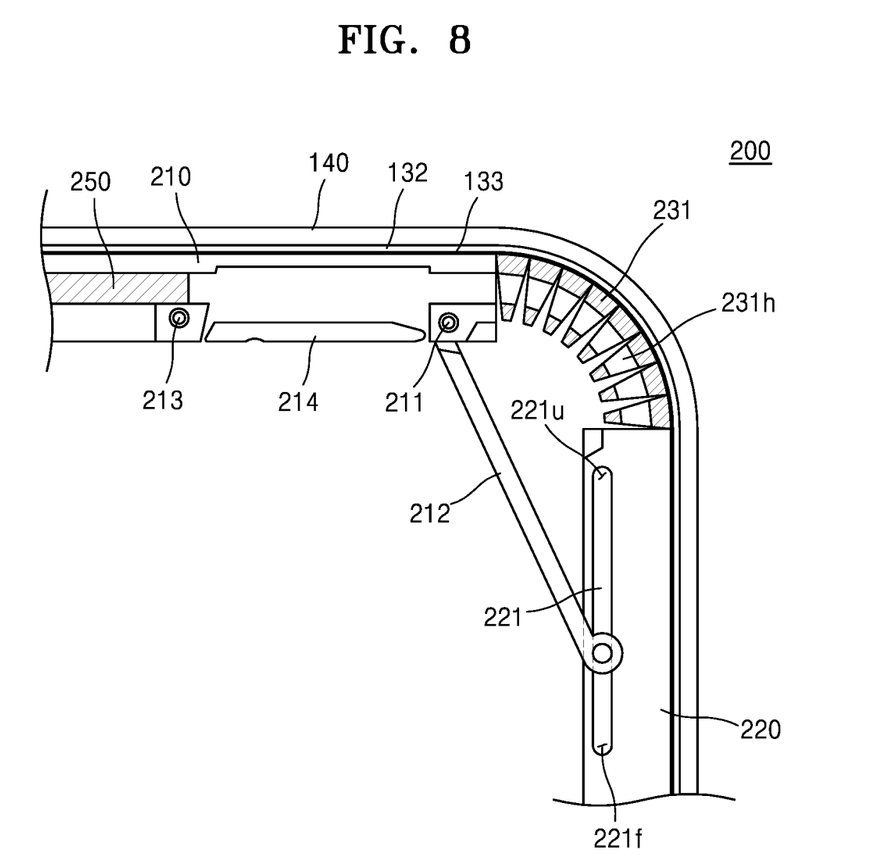
FIG. 8 is a schematic side sectional view of a foldable display apparatus according to an embodiment.

FIG. 8 is a side sectional view of a foldable display apparatus according to another embodiment.

Referring to FIG. 8, a first housing 210 includes a hinge cover 212 having an end that is pivotally connected to a first hinge shaft 211 that is adjacent a first housing 210, and the second housing 220 may further include a guide hole (e.g., a guide groove) 221 for guiding the hinge cover 212 having the other end to slide along a lengthwise direction of the second housing 220.

In addition, the first housing 210 may further include a second hinge shaft 213 provided away from the second housing 220, and a housing cover 214 that is pivotally connected to the second hinge shaft 213 to be rotated according to rotation of the hinge cover 212.

FIG. 8 shows a modified example of the foldable display apparatus 100 of FIG. 7A, and the foldable display apparatus 200 according to another embodiment may be completely folded like the foldable display apparatus 100 illustrated with reference to FIG. 7B.

That is, the other end of the hinge cover 212 accommodated in the guide hole 221 of FIG. 8 may slide according to the folding operation of the folding portion 230. Thus, when the foldable display apparatus 200 is completely folded, the other end of the hinge cover 212 may be located at a folding configuration (e.g., a first end) 221f of the guide hole 221, and when the foldable display apparatus 200 is unfolded, the other end of the hinge cover 212 may be located at an unfolding configuration (e.g., a second end that is opposite the first end) 221u of the guide hole 221.

According to the operation of the hinge cover 212, the first housing 210 and the second housing 220 may be rotatable between a folding configuration, as shown in FIG. 7B, and an unfolding configuration, as shown in FIGS. 6A and 6B.

According to the above described embodiments, the flexible display 140 is configured to fold in only one direction by using the hinge holder 150 that restricts the folding operation of the folding portion 230, and thus, the foldable display apparatuses 100/200 may prevent a buckling phenomenon from occurring at the folding region of the foldable display apparatuses 100/200.

It should be understood that embodiments described herein should be considered in a descriptive sense only, and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims and their equivalents.

What is claimed is:
1. A case assembly for a foldable display device, the case assembly comprising:
   a first housing;
   a second housing spaced apart from the first housing;
   a multi-joint structure located between the first housing and the second housing, and comprising a plurality of joints connected to each other;
   a sliding structure combined with the first housing; and
   first and second hinge covers respectively coupled to the first and second housings, configured to cover the multi-joint structure when the multi-joint structure is unfolded, and configured to be nested inside a cavity defined by the first housing and the second housing to be therein when the multi-joint structure is folded,
   wherein the sliding structure is combined with the first housing such that the sliding structure relatively moves with respect to the first housing in a second direction opposite to a first direction in which the first housing relatively moves with respect to the sliding structure,
   wherein the second direction is towards the multi-joint structure or away from the multi-joint structure,
   wherein the first housing has a first side and a second side opposite to the first side, the multi-joint structure has a third side and a fourth side opposite to the third side, and the second housing has a fifth side and a sixth side opposite to the fifth side, and wherein, when the multi-joint structure is unfolded, the first side, the third side, and the fifth side are on same side and the second side, the fourth side, and the sixth side are on same side.

2. The case assembly of claim 1, wherein, when the multi-joint structure is unfolded, the second side, the fourth side, and the sixth side are substantially planar.

3. The case assembly of claim 1, wherein the multi-joint structure is configured to be folded such that the second side and the sixth side are opposite to each other and the first side and the fifth side face each other; and wherein a width of each of the plurality of joints increases in a direction from the third side to the fourth side.

4. The case assembly of claim 3, wherein each of the plurality of joints has a substantially trapezoidal cross-section.

5. The case assembly of claim 3, wherein, when the multi-joint structure is folded such that the second side and the sixth side are opposite to each other and the first side and the fifth side face each other, the multi-joint structure has a substantially semicircular cross-section.

6. The case assembly of claim 1, wherein the multi-joint structure is configured to be folded such that the second side and the sixth side are opposite to each other and the first side and the fifth side face each other; and wherein, when the multi-joint structure is unfolded, the fourth side is relatively more planar than the third side.

7. The case assembly of claim 1, wherein at least a portion of the sliding structure is a rigid plate.

8. The case assembly of claim 1,
wherein the sliding structure has a first guiding part;
wherein the multi-joint structure has a second guiding part; and
wherein, when the multi-joint structure is unfolded, the first guiding part is configured to be inserted in the second guiding part.

9. The case assembly of claim 8, wherein, when the multi-joint structure is folded, the first guiding part is not inserted in the second guiding part.

10. The case assembly of claim 8, wherein the joints have a sub-guiding part in which the first guiding part is inserted when the multi-joint structure is unfolded; and
wherein the second guiding part comprises the sub-guiding part.

11. The case assembly of claim 10, wherein the sub-guiding part has a substantially trapezoidal cross-section.

12. The case assembly of claim 1, wherein, when the multi-joint structure is unfolded, the multi-joint structure and the sliding structure overlap each other.

13. The case assembly of claim 12, wherein, when the multi-joint structure is folded, the multi-joint structure and the sliding structure do not overlap each other.

14. The case assembly of claim 1, wherein, for the multi-joint structure to be unfolded, the sliding structure is relatively moved with respect to the first housing towards the multi-joint structure.

15. The case assembly of claim 14, wherein, for the multi-joint structure to be folded such that the second side and the sixth side are opposite to each other and the first side and the fifth side face each other, the sliding structure is relatively moved with respect to the first housing moved away from the multi-joint structure.

16. A foldable display device, comprising:
a first housing;
a second housing spaced apart from the first housing;
a multi-joint structure located between the first housing and the second housing and comprising a plurality of joints connected to each other;
a sliding structure combined with the first housing; and
first and second hinge covers configured to cover the multi-joint structure when the multi-joint structure is unfolded, and configured to be nested inside a cavity defined by the first housing and the second housing to be therein when the multi-joint structure is folded,
wherein the sliding structure is combined with the first housing such that the sliding structure relatively moves with respect to the first housing in a second direction opposite to a first direction in which the first housing relatively moves with respect to the sliding structure,
wherein the second direction is towards the multi-joint structure or away from the multi-joint structure,
wherein the first housing has a first side and a second side opposite to the first side, the multi-joint structure has a third side and a fourth side opposite to the third side, and the second housing has a fifth side and a sixth side opposite to the fifth side,
wherein, when the multi-joint structure is unfolded, the first side, the third side, and the fifth side are on same side and the second side, the fourth side, and the sixth side are on same side,
wherein the foldable display device further comprises a flexible display panel continuously located on the second side, the fourth side, and the sixth side and having a seventh side facing the second side, the fourth side, and the sixth side and an eighth side opposite to the seventh side, and
wherein, when the multi-joint structure is folded such that the second side and the sixth side are opposite to each other and the first side and the fifth side face each other, a portion of the eighth side corresponding to the multi-joint structure has a tensile force.

17. The foldable display device of claim 16, wherein, when the multi-joint structure is unfolded, the second side, the fourth side, and the sixth side are substantially planar.

18. The foldable display device of claim 16, wherein the multi-joint structure is configured to be folded such that the second side and the sixth side are opposite to each other and the first side and the fifth side face each other; and wherein a width of each of the plurality of joints increases in a direction from the third side to the fourth side.

19. The foldable display device of claim 18, wherein each of the plurality of joints has a substantially trapezoidal cross-section.

20. The foldable display device of claim 16, wherein, when the multi-joint structure is folded such that the second side and the sixth side are opposite to each other and the first side and the fifth side face each other, the multi-joint structure has a substantially semicircular cross-section.

21. The foldable display device of claim 16, wherein the multi-joint structure is configured to be folded such that the second side and the sixth side are opposite to each other and the first side and the fifth side face each other; and wherein, when the multi-joint structure is unfolded, the fourth side is relatively planar compared to the third side.

22. The foldable display device of claim 16, wherein at least a portion of the sliding structure is a rigid plate.

23. The foldable display device of claim 16,
wherein the sliding structure has a first guiding part;
wherein the multi-joint structure has a second guiding part; and wherein, when the multi-joint structure is unfolded, the first guiding part is configured to be inserted in the second guiding part.

24. The foldable display device of claim 23, wherein, when the multi-joint structure is folded, the first guiding part is not inserted in the second guiding part.

25. The foldable display device of claim 23, wherein the multi-joint structure has a sub-guiding part in which the first guiding part is inserted when the multi-joint structure is unfolded; and wherein the second guiding part comprises the sub-guiding part.

26. The foldable display device of claim 25, wherein the sub-guiding part has a substantially trapezoidal cross-section.

27. The foldable display device of claim 16, wherein, when the multi-joint structure is unfolded, the multi-joint structure and the sliding structure overlap each other.

28. The foldable display device of claim 27, wherein, when the multi-joint structure is folded, the multi-joint structure and the sliding structure do not overlap each other.

29. The foldable display device of claim 16, wherein, for the multi-joint structure to be unfolded, the sliding structure is relatively moved with respect to the first housing towards the multi-joint structure.

30. The foldable display device of claim 29, wherein, for the multi-joint structure to be folded such that the second side and the sixth side are opposite to each other and the first side and the fifth side face each other, the sliding structure is relatively moved with respect to the first housing away from the multi-joint structure.

31. A case assembly for a foldable display device, the case assembly comprising:

a first housing;

a second housing spaced apart from the first housing;

a multi-joint structure located between the first housing and the second housing and comprising a plurality of joints connected to each other;

a sliding structure combined with the first housing such that the sliding structure slides together with the first housing in a direction towards the multi-joint structure or away from the multi-joint structure; and first and second hinge covers configured to cover the multi-joint structure when the multi-joint structure is unfolded, and configured to be nested inside a cavity defined by the first housing and the second housing to be therein when the multi-joint structure is folded.

* * * * *